(12) United States Patent
Huang

(10) Patent No.: US 8,191,612 B2
(45) Date of Patent: Jun. 5, 2012

(54) COOLER MODULE WITHOUT BASE PANEL

(76) Inventor: Tsung-Hsien Huang, I-Lan Hsien (TW)

( * ) Notice: Subject to any disclaimer, the term of this patent is extended or adjusted under 35 U.S.C. 154(b) by 1002 days.

(21) Appl. No.: 12/047,324

(22) Filed: Mar. 13, 2008

(65) Prior Publication Data

US 2009/0178787 A1    Jul. 16, 2009

(30) Foreign Application Priority Data

Jan. 11, 2008 (TW) .............................. 97101122 A

(51) Int. Cl.
*F28D 15/00* (2006.01)
*H05K 7/20* (2006.01)
(52) U.S. Cl. .................... 165/80.3; 165/104.21
(58) Field of Classification Search ............. 165/80.2, 165/80.3, 185, 104.33, 104.21; 361/697, 361/700, 704; 257/715; 174/15.2
See application file for complete search history.

(56) References Cited

U.S. PATENT DOCUMENTS

| 2,092,170 | A * | 9/1937 | Kritzer et al. | 29/890.046 |
| 6,853,555 | B2 * | 2/2005 | Fichera et al. | 361/700 |
| 7,394,656 | B1 * | 7/2008 | Huang et al. | 361/700 |
| 7,447,035 | B2 * | 11/2008 | Liu et al. | 361/719 |
| 7,478,668 | B2 * | 1/2009 | Chen et al. | 165/104.33 |
| 7,597,134 | B2 * | 10/2009 | Min et al. | 165/80.3 |
| 2005/0103474 | A1 * | 5/2005 | Lee et al. | 165/104.33 |
| 2005/0263265 | A1 * | 12/2005 | Sheng et al. | 165/104.21 |
| 2006/0181848 | A1 * | 8/2006 | Kiley et al. | 361/697 |
| 2007/0215327 | A1 * | 9/2007 | Lai et al. | 165/104.33 |
| 2008/0028610 | A1 * | 2/2008 | Chen | 29/890.03 |

FOREIGN PATENT DOCUMENTS

JP          2005203665 A  *   7/2005

\* cited by examiner

*Primary Examiner* — Tho V Duong
(74) *Attorney, Agent, or Firm* — Pai Patent & Trademark; Chao-Chang David Pal

(57) ABSTRACT

A light, compact, non-bottom panel type cooler module includes a plurality of radiation fins arranged in a stack, and a plurality of U-shaped heat pipes fastened to the radiation fins to hold the radiation fins in parallel, each U-shaped heat pipe having one or two opposite end pipe sections thereof press-fitted into respective through holes on the radiation fins and a flat bottom surface portion exposed to the outside of the radiation fins for bonding to a semiconductor device for enabling the heat pipes to transport heat from the semiconductor device to the radiation fins for dissipation.

3 Claims, 10 Drawing Sheets

COOLER MODULE WITHOUT BASE PANEL

BACKGROUND OF THE INVENTION (a) Field of the Invention

The present invention relates to cooler modules and more particularly, to a light, compact, non-base panel type cooler module formed of radiation fins and heat pipes, wherein each heat pipe has a flat bottom surface portion exposed to the outside of the radiation fins for bonding to a semiconductor device to transport heat from the semiconductor device to the radiation fins for quick dissipation.

(b) Description of the Prior Art

A conventional cooler module is known comprising a heat sink and a plurality of heat pipes fastened to the heat sink. The heat sink comprises a base panel and a plurality of radiation fins extended from the base panel. The base panel is made out of copper or aluminum, and adapted for transporting heat from, for example, a semiconductor chip to the radiation fins for quick dissipation into the outside open air. The radiation fins are extruded from aluminum or copper. The heat pipes are sealed hollow pipes filled with a working fluid. Each heat pipe has one end or the both two ends fastened to the radiation fins subject to the type (horizontal or vertical) of the design of the cooler module. Further, a fan may be used with the heat sink to enhance the heat dissipation efficiency.

According to the aforesaid cooler module, the base panel of the heat sink works as a heat transfer medium to transfer heat energy from the semiconductor device to the heat pipe and the radiation fins for dissipation. The heat pipes are bonded to the base panel of the heat sink with a solder paste. Because the heat pipes and the base panel of the heat sink are made out of different materials, the heat pipes must be plated with a layer of nickel before bonding. This mounting procedure is complicated, increasing the cost. Further, the bonding process is not in conformity with environmental protection requirements. Because the base panel is a solid metal block, the heat sink is big and heavy, and the material cost for the heat sink is high.

Further, the radiation fins, the heat pipes and the base panel have different thermal conductivity (K value). The K value of copper is about 500. The K value of aluminum is about 300~400. However, the K value of the heat pipes can be as high as 2000~4000, i.e., the thermal conductivity of the heat pipes is much higher than the copper or aluminum radiation fins and the copper or aluminum base panel. Therefore, the aforesaid conventional cooler module cannot quickly dissipate heat at the beginning.

SUMMARY OF THE INVENTION

The present invention has been accomplished under the circumstances in view. According to one aspect of the present invention, the cooler module comprises a plurality of radiation fins, and a plurality of heat pipes fastened to the radiation fins to hold the radiation fins in parallel. Each heat pipe has a flat bottom surface portion exposed to the outside of the radiation fins for bonding to a semiconductor device for enabling the heat pipes to transport heat from the semiconductor device to the radiation fins for quick dissipation. Because the cooler module eliminates the use of a base panel, saving much the material cost and greatly reducing the size to facilitate packing and delivery.

According to another aspect of the present invention, the radiation fins are arranged in a stack to form a horizontal or vertical block-like radiation fin module. The heat pipes are sealed hollow U-pipes filled with a working fluid, each having a first end pipe section and a second end pipe section. The first end pipe section or the both the first and second end pipe sections of each of the heat pipes are fastened to the radiation fins. The bottom flat surface portion of each heat pipe can be located on the bottom side of one end or middle part thereof subject to the type (horizontal or vertical) of the design of the cooler module.

According to still another aspect of the present invention, each radiation fin has a plurality of bottom notches arranged in parallel for receiving the second end pipe sections of the heat pipes peripherally partially surrounded by the radiation fins, and the second end pipe sections of the heat pipes are respectively tightly fastened to the bottom notches of the radiation fins by means of press-fitting.

In one alternate form of the present invention, the radiation fins include a plurality of first radiation fins and at least one second radiation fin. The first radiation fins are arranged in a stack, and the at least one second radiation fin is attached to one side of the stack of first radiation fins. The first end pipe sections of the heat pipes are respectively fastened to the first radiation fins and the at least one second radiation fin. The second end pipe sections of the heat pipes are respectively tightly fastened to the at least one second radiation fin and suspending below the first radiation fins.

In another alternate form of the present invention, the cooler module further comprises two side plates respectively attached to two opposite sides of the horizontal block-like radiation fin module. The side plates support the second end pipe sections of the heat pipes below the radiation fins.

According to still another aspect of the present invention, the flat bottom surface portions of the heat pipes are abutted against one another and kept in flush.

In still another alternate form of the present invention, the radiation fins are arranged in a stack to form a block-like radiation fin module. The block-like radiation fin module has two horizontally extending mounting through holes for receiving two locating bars for the mounting of a mounting frame.

In still another alternate form of the present invention, the radiation fins are arranged in a stack to form a block-like radiation fin module. The block-like radiation fin module has a plurality of vertically extending mounting through holes for receiving two U-bars for the mounting of a mounting frame.

DETAILED DESCRIPTION OF THE PREFERRED EMBODIMENTS

Figure 1:
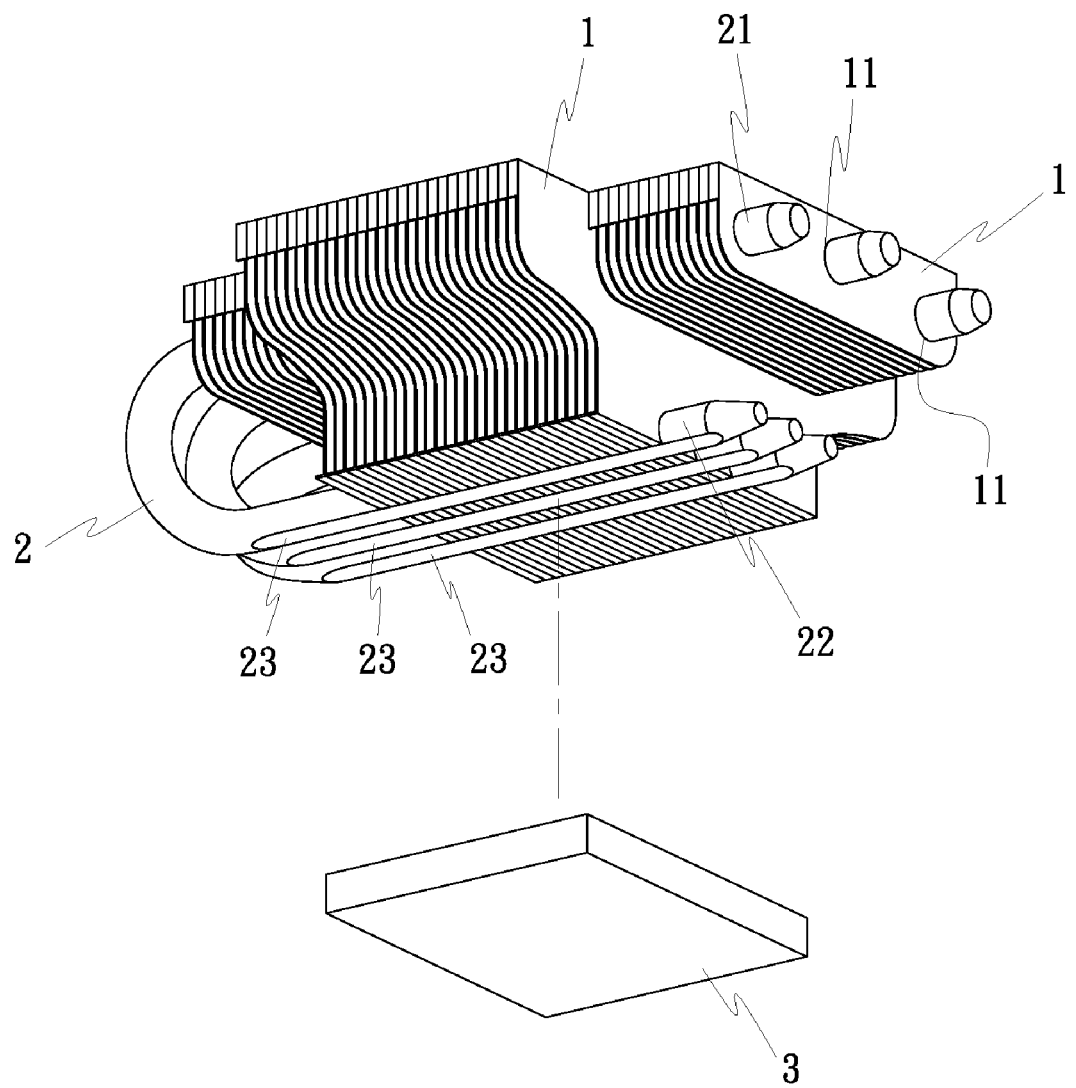
FIG. 1 is an oblique bottom elevation of a cooler module in accordance with a first embodiment of the present invention (not in contact with the CPU).
Figure 2:
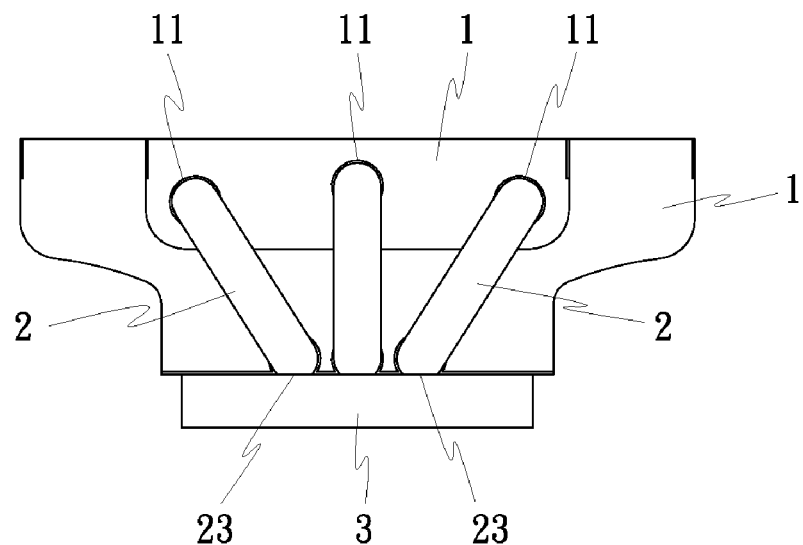
FIG. 2 is a side view of the cooler module in accordance with the first embodiment of the present invention when kept in contact with the CPU.
Figure 3:
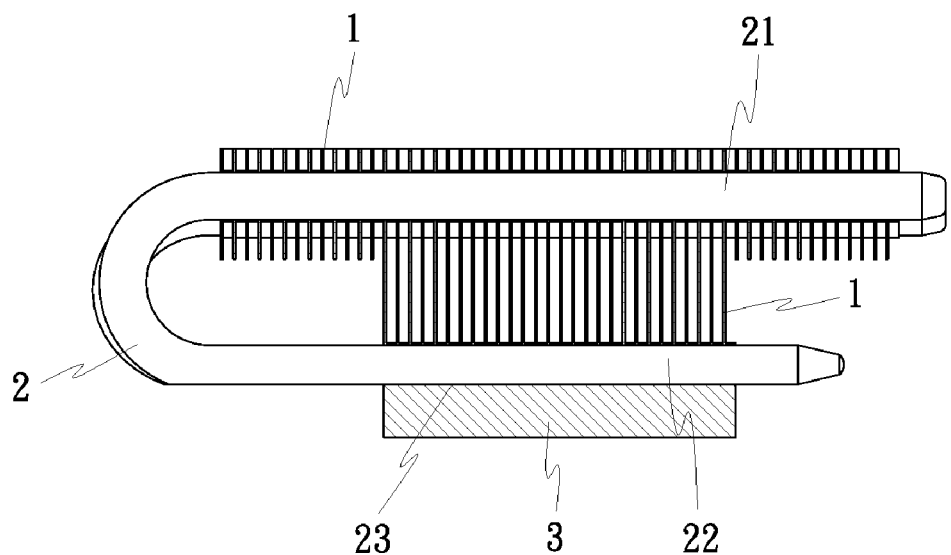
FIG. 3 is a sectional view of the cooler module in accordance with the first embodiment of the present invention when kept in contact with the CPU.

Referring to FIGS. 1~4, a cooler module in accordance with a first embodiment of the present invention is a horizontal design, comprised of a plurality of radiation fins 1 and a plurality of heat pipes 2.

The radiation fins 1 are arranged in a stack, forming a block-like radiation fin module. The radiation fins 1 may be made in any of a variety of sizes and shapes for horizontal mounting. Each radiation fin 1 has a plurality of horizontal through holes 11 horizontally cut through two opposite sides thereof and a plurality of bottom notches 12 arranged in parallel on the bottom side thereof for the mounting of the heat pipes 2.

The heat pipes 2 are sealed hollow U-pipes filled with a working fluid, each having a first end pipe section 21 and a second end pipe section 22. The first end pipe section 21 is tightly inserted through one respective horizontal through hole 11 of each of the radiation fins 1. The second end pipe section 21 is press-fitted into one respective bottom notch 12 of each of the radiation fins 1, having a flat bottom surface portion 23 kept in flush with the bottom edge of each of the radiation fins 1 for positive contact with the surface of a semiconductor device, for example, CPU 3.

As stated above, the aforesaid horizontal mounting type cooler module is comprised of multiple radiation fins 1 and multiple heat pipes 2, and the heat pipes 2 are tightly fitted into the radiation fins 1 with the flat bottom surface portion 23 of each of the heat pipes 2 and the bottom edge of each of the radiation fins 1 kept in positive contact with the top surface of the CPU 2 for dissipating heat from the CPU 2 into outside open air. The high thermal conductivity (high K value) heat pipes 2 transport large quantities of heat from the CPU 2 to the radiation fins 1 for dissipation into the outside open air efficiently. Because the cooler module eliminates a conventional thermal-transfer metal base block (bottom panel), the dimension and weight of the cooler module are greatly reduced, saving much the material cost for solid metal base block (bottom panel) as well as the packing and transportation costs.

Figure 4:
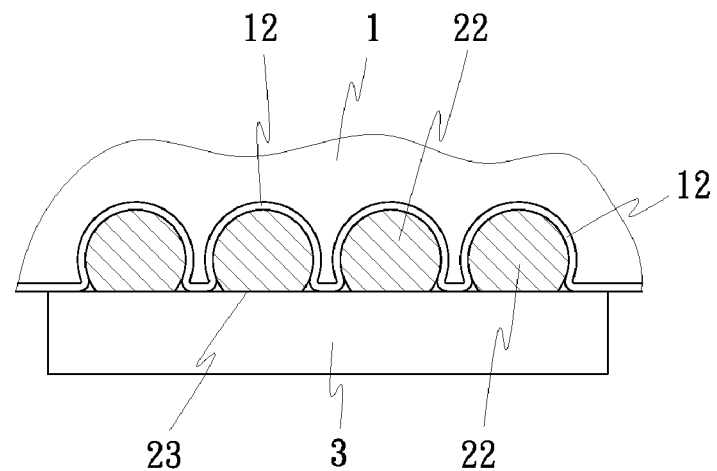
FIG. 4 is a sectional view in an enlarged scale of a part of FIG. 2.

As shown in FIG. 4, the second end pipe sections 22 of the heat pipes 2 are tightly fitted into the bottom notches 12 of the radiation fins 12 and kept in parallel. When installed, the second end pipe sections 22 of the heat pipes 2 are peripherally and partially surrounded by the radiation fins 1, and the flat bottom surface portions 23 of the heat pipes 2 and the bottom edge of each of the radiation fins 1 are kept in positive contact with the top surface of the CPU 3. Further, the flat bottom surface portions 23 of the heat pipes 2 may be coated with thermal paste, thermal compound or the like (not shown) to increase thermal conductivity between the CPU 3 and the heat pipes 2.

Figure 5:
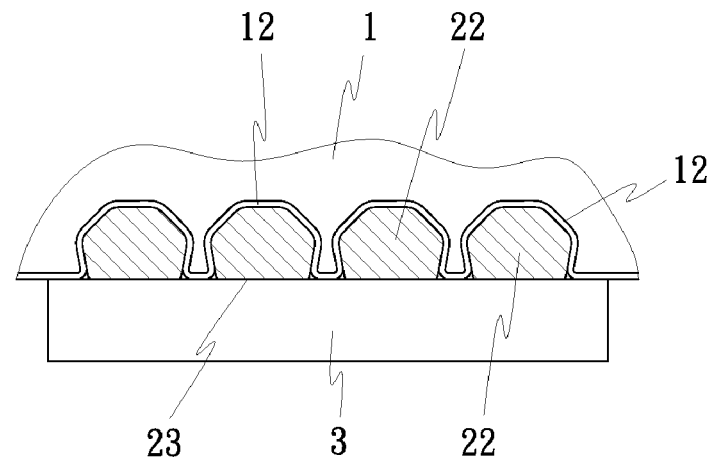
FIG. 5 corresponds to FIG. 4, showing a different shape of the bottom notches of the radiation fins.

The bottom notches 12 of the radiation fins 1 can be made in any of a variety of shapes without limitation. For example, the bottom notches 12 can be made having a semicircular shape as shown in FIG. 4, polygonal shape as shown in FIG. 5, triangular shape (not shown), or any other regular or irregular shape. However, the configuration of the second end pipe sections 22 of the heat pipe 2 must match the shape of the bottom notches 12 of the radiation fins 1.

Figure 6:
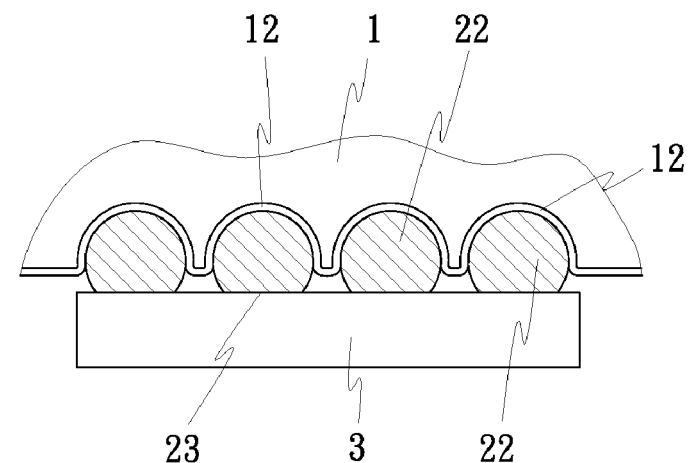
FIG. 6 corresponds to FIG. 4, showing the second pipe sections of the heat pipes superficially fitted into the bottom notches of the radiation fins and the bottom edge of each of the radiation fins kept spaced above the top surface of the CPU at a distance.

In FIGS. 1~5, the flat bottom surface portions 23 of the second end pipe sections 22 of the heat pipe 2 are kept in flush with the bottom edge of each of the radiation fins 1. Alternatively, the second end pipe sections 22 of the heat pipe 2 can be superficially fitted into the bottom notches 12 of the radiation fins 1 with the flat bottom surface portions 23 spaced below the bottom edge of each of the radiation fins 1 at a distance for contacting the CPU 3, as shown in FIG. 6.

Figure 7:
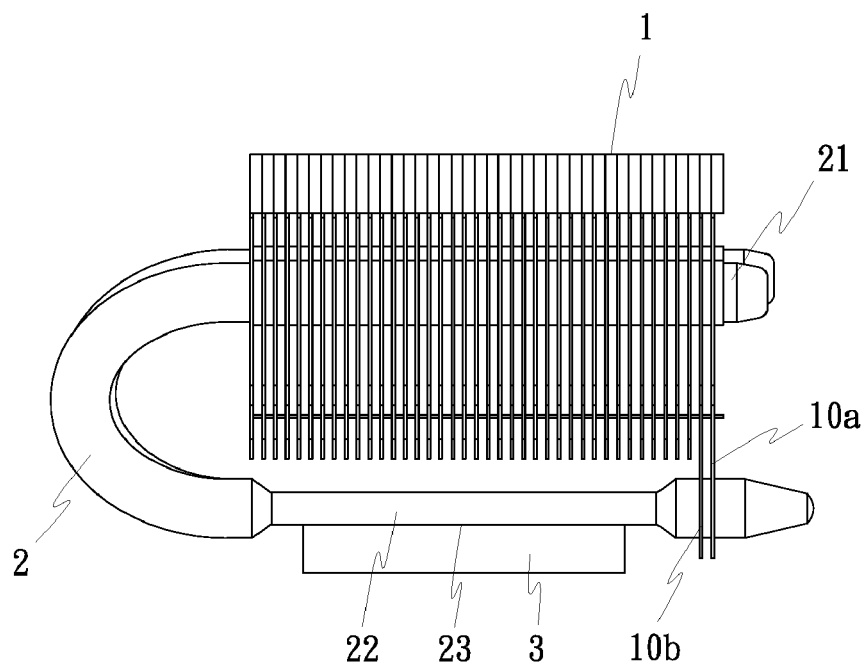
FIG. 7 is a sectional assembly view of a cooler module in accordance with a second embodiment of the present invention.
Figure 8:
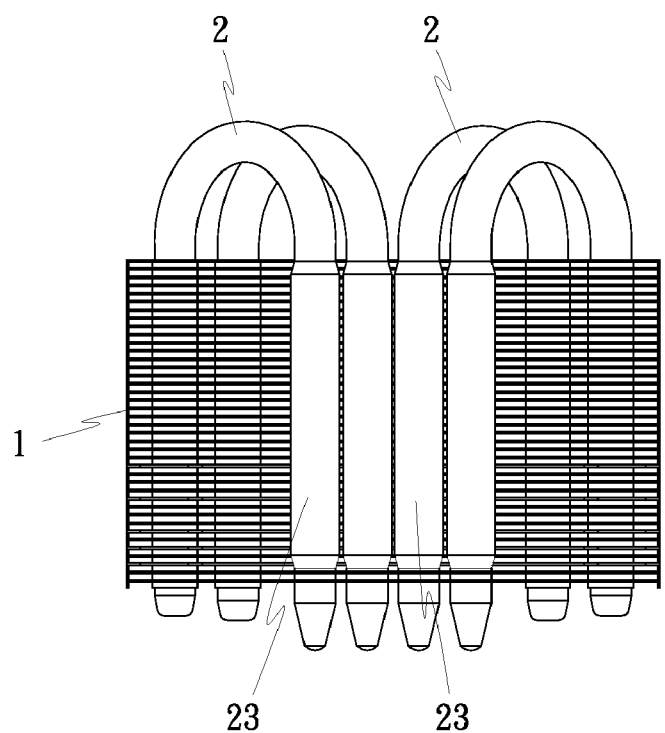
FIG. 8 is a bottom view of the assembly shown in FIG. 7.

FIGS. 7 and 8 show a cooler module in accordance with a second embodiment of the present invention. This second embodiment is a horizontal design. According to this second embodiment, the cooler module is comprised of a plurality of first radiation fins 1, at least one, for example, two second radiation fins 10a and 10b, and a plurality of heat pipes 2. The first radiation fins 1 and the second radiation fins 10a and 10b are arranged in a stack. The second radiation fins 10a and 10b are arranged in parallel at one side of the first radiation fins 1. The second radiation fins 10a and 10b have a vertical height relatively greater than the first radiation fins 1. When the first radiation fins 1 and the second radiation fins 10a and 10b are arranged in a stack, the top edges of the radiation fins 1, 10a and 10b are in flush, and the bottom edges of the second radiation fins 10a and 10b downwardly protrude over the bottom edges of the first radiation fins 1. Each heat pipe 2 has a first end pipe section 21 fastened to the radiation fins 1, 10a and 10b, and a second end pipe section 21 fastened to the second radiation fins 10a and 10b and suspending below the first radiation fins 1 at a distance. During application, the second end pipe section 21 of each heat pipe 2 has a flat bottom surface portion 23 disposed in positive contact with the top surface of a CPU 3. Further, the flat bottom surface portion 23 of each heat pipe 2 may be coated with a thermal paste, thermal compound or the like (not shown) to increase thermal conductivity between the CPU 3 and the heat pipes 2.

Figure 9:
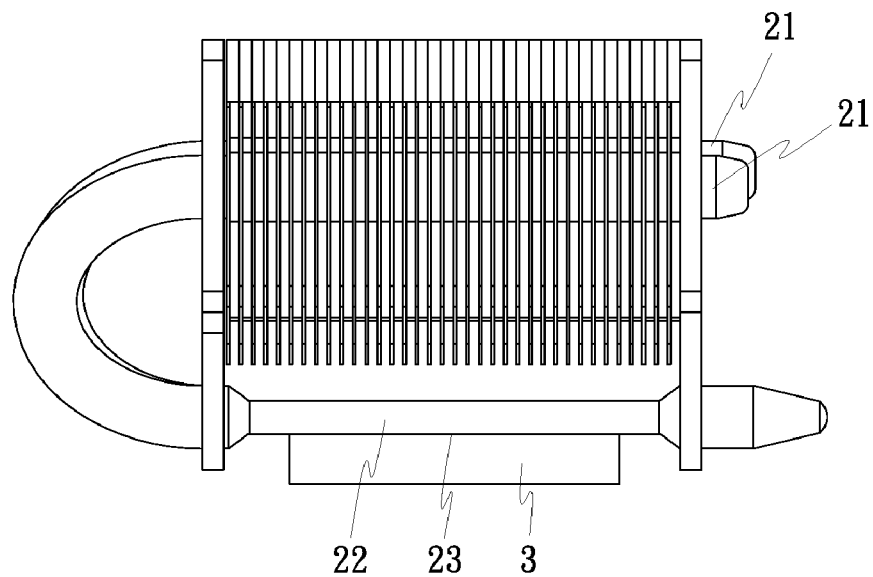
FIG. 9 is a sectional assembly view of a cooler module in accordance with a third embodiment of the present invention.
Figure 10:
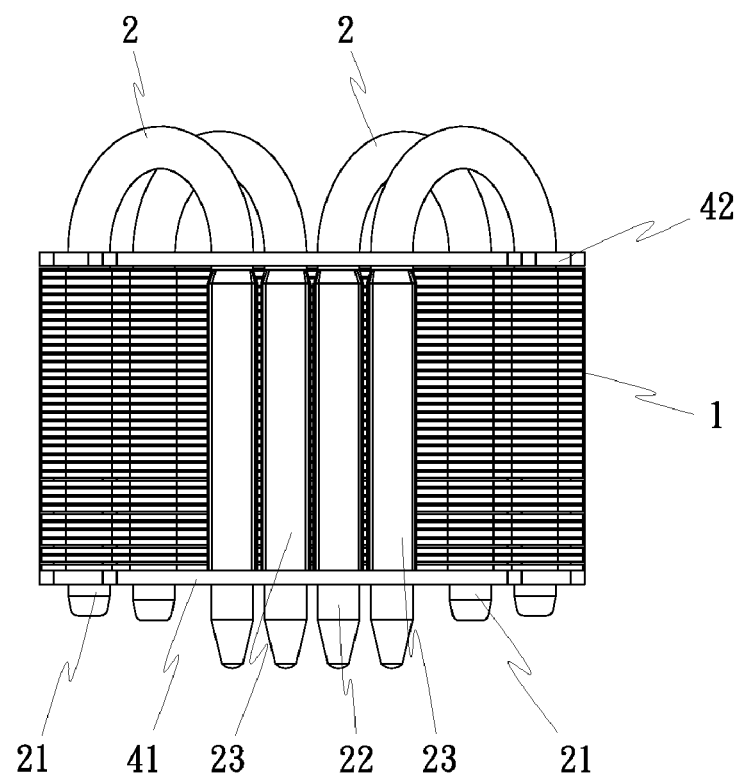
FIG. 10 is a bottom view of the cooler module in accordance with the third embodiment of the present invention.

FIGS. 9 and 10 show a cooler module in accordance with a third embodiment of the present invention. This third embodiment is a horizontal design. According to this third embodiment, the cooler module is comprised of a plurality of radiation fins 1, two side plates 41 and 42, and a plurality of heat pipes 2. The radiation fins 1 are arranged in a stack and set between the two side plates 41 and 42. The heat pipes 2 are U-pipes, each having a first end pipe section 21 respectively fastened to the side plates 41 and 42 and the radiation fins 1 and a second end pipe section 22 fastened to the side plates 41 and 42 and suspending below the radiation fins 1. The second end pipe section 22 of each heat pipe 2 has a flat bottom surface portion 23 kept in positive contact with the top surface of a semiconductor chip, for example, CPU 3.

Figure 11:
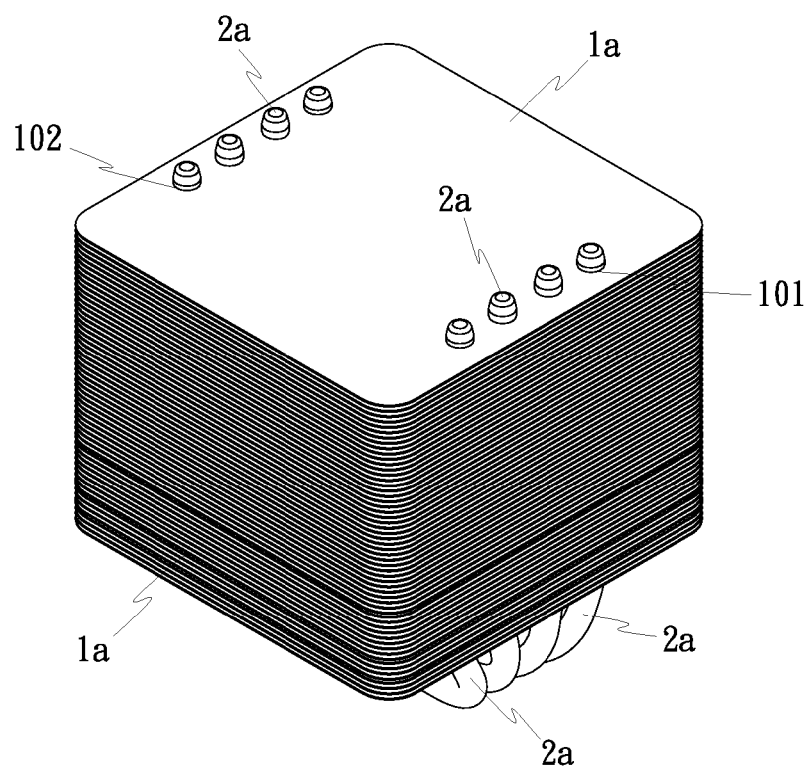
FIG. 11 is an oblique top elevation of a cooler module in accordance with a fourth embodiment of the present invention.
Figure 12:
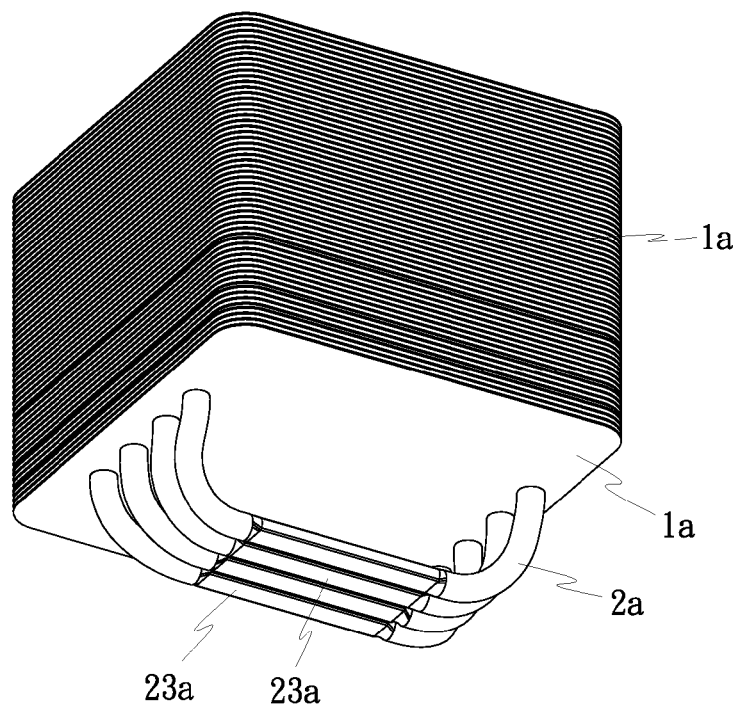
FIG. 12 is an oblique bottom elevation of the cooler module in accordance with the fourth embodiment of the present invention.
Figure 13:
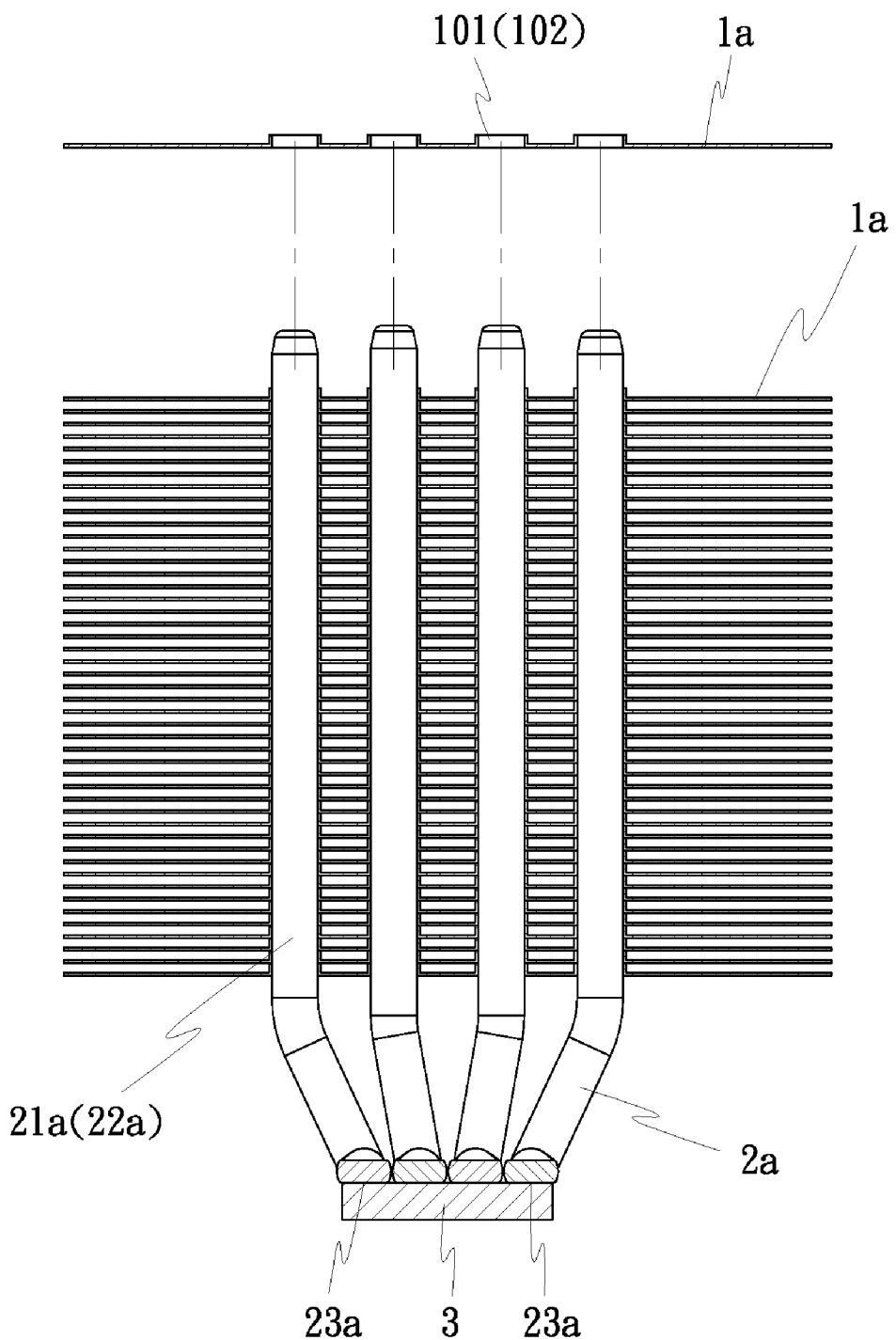
FIG. 13 is a schematic drawing showing an assembly status of the cooler module in accordance with the fourth embodiment of the present invention.

FIGS. 11 through 13 show a cooler module in accordance with a fourth embodiment of the present invention. This fourth embodiment is a horizontal design. According to this fourth embodiment, the cooler module is comprised of a plurality of radiation fins 1a, and a plurality of heat pipes 2a.

The radiation fins 1a are arranged in a stack, forming a block-like radiation module. The radiation fins 1a may be made in any of a variety of sizes and shapes for vertical application. Each radiation fin 1a has a plurality of through holes 101 and 102 vertically cut through the top and bottom sides thereof and arranged in two rows at two sides for the mounting of the heat pipes 2a. The heat pipes 2a are sealed hollow U-pipes filled with a working fluid and arranged in vertical in a parallel manner, each having two opposite end pipe section 21a and 22a respectively tightly fitted into the through holes 101 and 102 of the radiation fins 1a and a flat bottom surface portion 23a on the bottom side of the middle part thereof for positive contact with the top surface of a semiconductor device, for example, CPU 3.

Either of the aforesaid horizontal type or vertical type cooler modules, bottom flat surface portions 23 or 23a of the heat pipes 2 or 2a are closely abutted against one another and bonded to the hotter interface (CPU) 3 to transport heat from the hotter interface (CPU) 3 to the colder interface (radiation fins) 2 or 2a rapidly.

Figure 14:
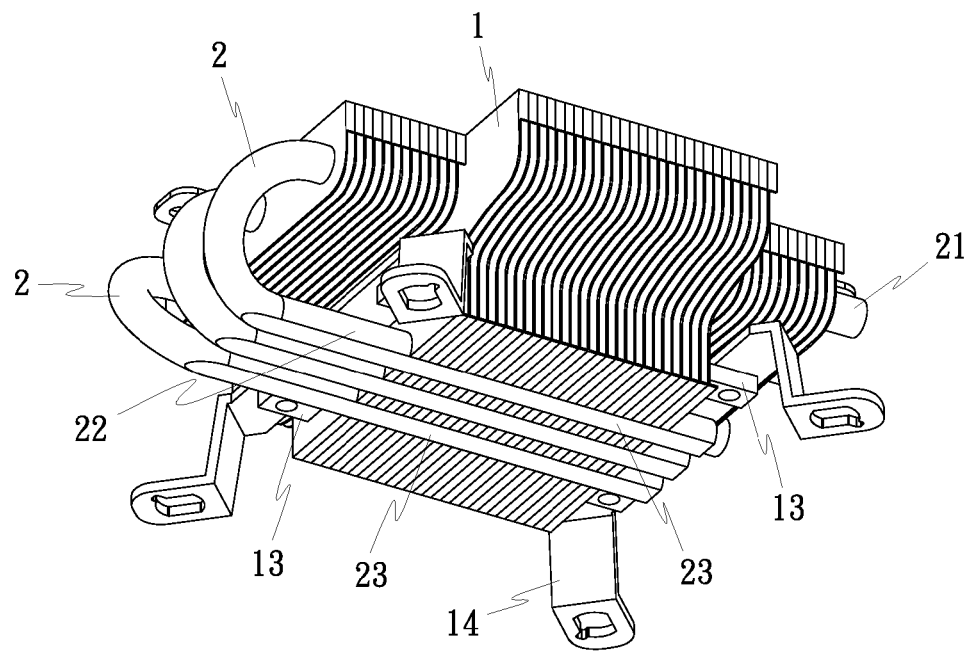
FIG. 14 is an oblique bottom elevation of a cooler module in accordance with a fifth embodiment of the present invention.
Figure 15:
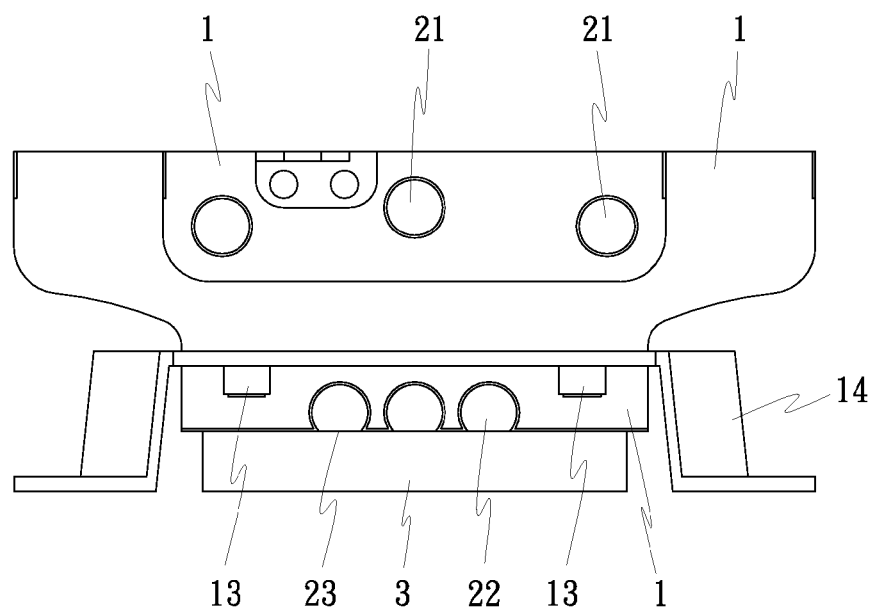
FIG. 15 is a schematic side view of FIG. 14.

FIGS. 14 and 15 show a horizontal type cooler module in accordance with a fifth embodiment of the present invention. According to this fifth embodiment, the radiation fin module of the radiation fins 1 has two horizontal through holes (not shown) for the mounting of two locating bars 13, and a mounting frame 14 is used with the locating bars 13 to affix the cooler module in place, keeping the flat bottom surface portions 23 in positive contact with the hotter interface (CPU) 3.

Figure 16:
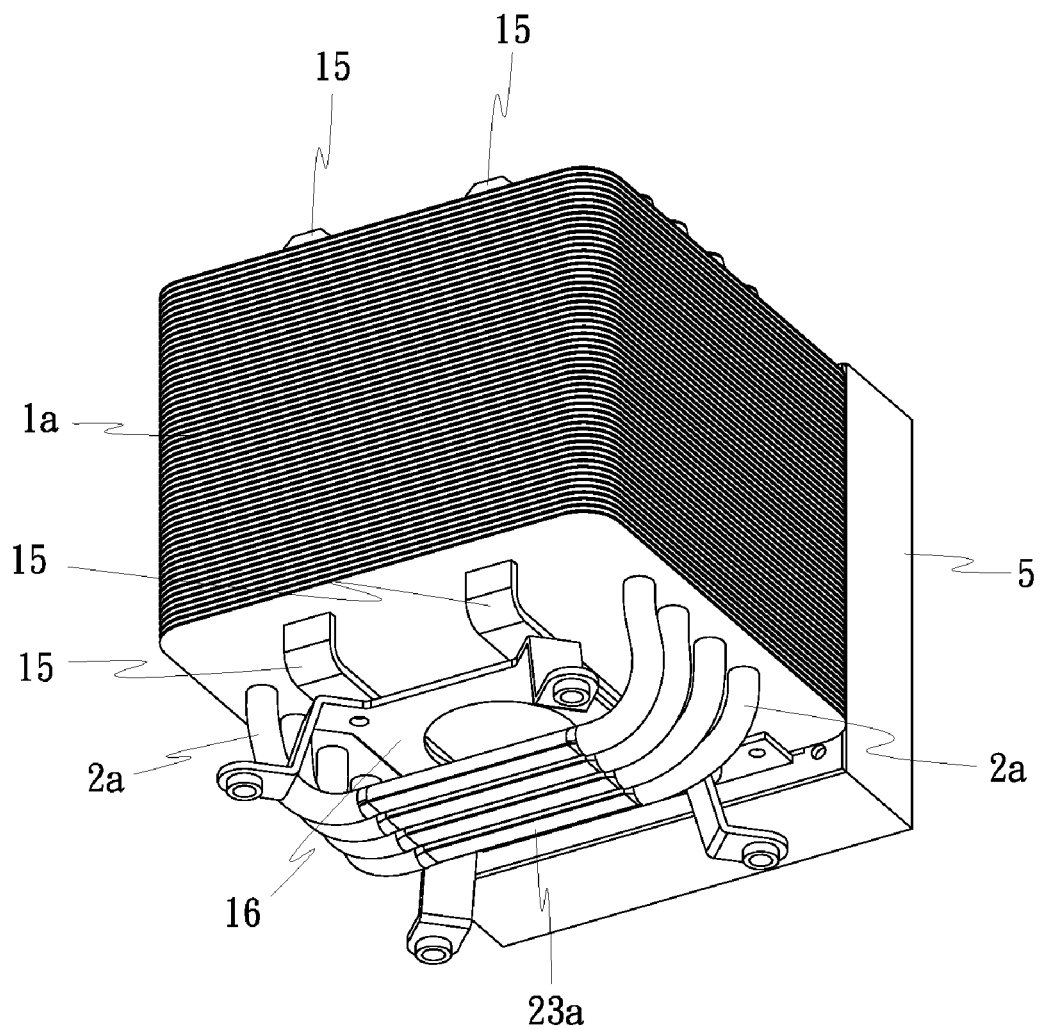
FIG. 16 is an oblique bottom elevation of a cooler module in accordance with a sixth embodiment of the present invention.
Figure 17:
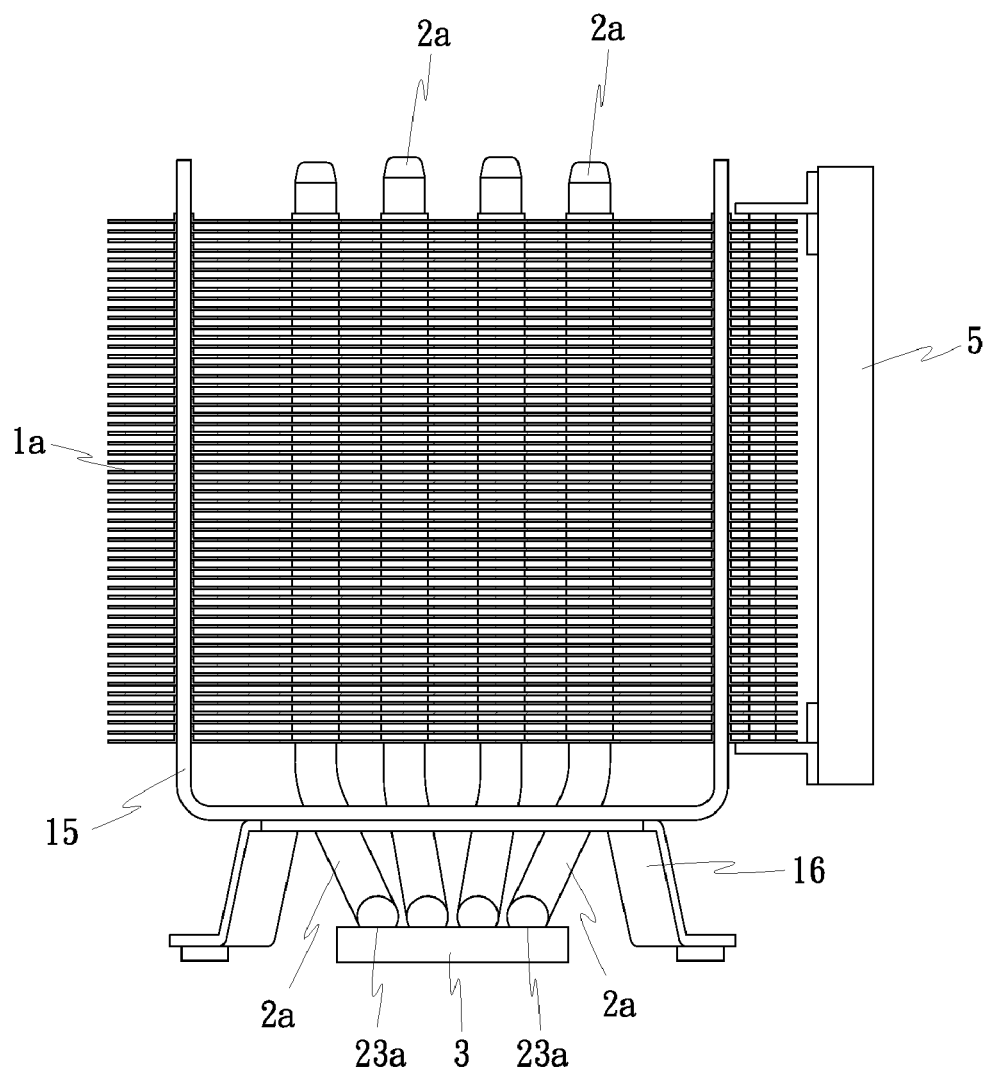
FIG. 17 is a schematic side view of FIG. 17.

FIGS. 16 and 17 show a vertical type cooler module in accordance with a sixth embodiment of the present invention. According to this sixth embodiment, the radiation fin module of the radiation fins 1a has two vertical through holes (not shown) for the mounting of two U-bars 15, and a mounting frame 16 is used with the locating bars 13 to affix the cooler module in place, keeping the flat bottom surface portions 23a of the heat pipes 2 in positive contact with the hotter interface (CPU) 3. Further, electric fan or fans may be installed in one side, the center, or two opposite sides of the radiation fin module of the radiation fins 1a to enhance the heat dissipating efficiency. According to this sixth embodiment, a fan 5 may be fastened to one side of the radiation fin module of the radiation fins 1a to enhance the heat dissipation efficiency.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A cooler module, comprising:
    a plurality of radiation fins; and
    a plurality of heat pipes fastened to said radiation fins to hold said radiation fins in parallel, each said heat pipe having a first end pipe section and a second end pipe section, the second end pipe section having a flat bottom surface portion exposed to the outside of said radiation fins for bonding to a semiconductor device for enabling said heat pipes to transport heat from said semiconductor device to said radiation fins for dissipation,
    wherein said radiation fins are arranged in a stack to form a horizontal block-like radiation fin module, each said radiation fin having a plurality of full through holes cut through two opposite sides thereof for the mounting of said heat pipes; said heat pipes are sealed hollow U-pipes with the first end pipe sections respectively and tightly fitted into the full through holes of said radiation fins,
    wherein each said radiation fin has a bottom side and a plurality of bottom notches formed on the bottom side; the second end pipe sections of said heat pipes are respectively tightly fastened to the bottom notches of said radiation fins and peripherally contacted with the bottom notches of said radiation fins with the flat bottom surface portions in flush with the bottom sides of said radiation fins, such that the bottom sides of said radiation fins and the flat bottom surface portions of the second end pipe sections together form a single flat surface as a bottom-most portion of the cooler module,
    wherein the bottom notches have a bottom opening narrower than immediately inside the bottom opening for keeping the second end pipe sections of said heat pipes tightly fastened to the bottom notches of said radiation fins.

2. The cooler module as claimed in claim 1, wherein the second end pipe sections of said heat pipes are respectively tightly fastened to the bottom notches of said radiation fins by means of press-fitting.

3. The cooler module as claimed in claim 1, wherein said block-like radiation fin module has two horizontally extending mounting through holes for receiving two locating bars for the mounting of a mounting frame.

* * * * *